United States Patent
Hsu et al.

(10) Patent No.: US 11,316,532 B1
(45) Date of Patent: Apr. 26, 2022

(54) DECODING OF LOW-DENSITY PARITY-CHECK CODES WITH HIGH-DEGREE VARIABLE NODES

(71) Applicant: SK hynix Inc., Icheon-si (KR)

(72) Inventors: Michael Hsu, Los Altos, CA (US); Hongwei Duan, Cupertino, CA (US); Aman Bhatia, San Jose, CA (US)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/125,367

(22) Filed: Dec. 17, 2020

(51) Int. Cl.
*H03M 13/11* (2006.01)

(52) U.S. Cl.
CPC ...... *H03M 13/1108* (2013.01); *H03M 13/116* (2013.01)

(58) Field of Classification Search
CPC .................. H03M 13/1108; H03M 13/116
See application file for complete search history.

(56) References Cited

U.S. PATENT DOCUMENTS

| | | | | |
|---|---|---|---|---|
| 8,291,292 B1* | 10/2012 | Varnica | ................ | G06F 11/073 714/758 |
| 10,594,339 B2 | 3/2020 | Panteleev et al. | | |
| 2005/0149842 A1* | 7/2005 | Kyung | ................. | H03M 13/27 714/800 |
| 2005/0216821 A1* | 9/2005 | Harada | ............. | H03M 13/6362 714/801 |
| 2007/0011567 A1* | 1/2007 | Choi | ................. | H03M 13/6356 714/758 |
| 2011/0099448 A1 | 4/2011 | Mohsenin et al. | | |
| 2012/0066563 A1* | 3/2012 | Obata | ................. | H03M 13/112 714/752 |
| 2020/0220557 A1* | 7/2020 | Reynwar | ............ | H03M 13/1137 |
| 2021/0167796 A1* | 6/2021 | Xiong | ................. | G06F 11/1012 |
| 2021/0242882 A1* | 8/2021 | Asadi | ................. | G06F 11/1068 |

* cited by examiner

*Primary Examiner* — Thien Nguyen
(74) *Attorney, Agent, or Firm* — Perkins Coie LLP

(57) ABSTRACT

Devices, systems and methods for improving decoding operations of a decoder are described. An example method includes receiving a noisy codeword that is based on a transmitted codeword generated from a low-density parity-check (LDPC) code, the LDPC code having an associated parity matrix comprising N columns, wherein each of at least B columns of the parity matrix has a column weight that exceeds a predetermined column weight, processing the N columns based on a message passing algorithm, and determining, based on the processing, a candidate version of the transmitted codeword, wherein the processing for each of the N columns comprises performing a read operation, a variable node update (VNU) operation, and a check node update (CNU) operation on the first set and the second set, the read operation and the CNU operation on each of the at least B columns spanning two or more time-steps.

20 Claims, 8 Drawing Sheets

| Time | Stage 1: Read CN memory | Stage 2: VNU operation | Stage 3: CNU operation |
|---|---|---|---|
| t = 1 | Column 1 | | |
| t = 2 | Column 2 | Column 1 | |
| t = 3 | Column 3 | Column 2 | Column 1 |
| t = 4 | Column 4 | Column 3 | Column 2 |
| t = 5 | Column 5 | Column 4 | Column 3 |
| t = 6 | Column 6 | Column 5 | Column 4 |
| ... | ... | ... | ... |

*FIG. 7*

| Time | Stage 1: Read CN memory | Stage 2: VNU operation | Stage 3: CNU operation |
|---|---|---|---|
| t = 1 | Column 1 Set 1/2 | | |
| t = 2 | Column 1 Set 2/2 | | |
| t = 3 | | Column 1 | |
| t = 4 | Column 2 Set 1/2 | | Column 1 Set 1/2 |
| t = 5 | Column 2 Set 2/2 | | Column 1 Set 2/2 |
| t = 6 | | Column 2 | |
| t = 7 | Column 3 Set 1/2 | | Column 2 Set 1/2 |
| t = 8 | Column 3 Set 2/2 | | Column 2 Set 2/2 |
| t = 9 | | Column 3 | |
| ... | ... | ... | ... |
| t = 3B-1 | Column B Set 2/2 | | Column B-1 Set 2/2 |
| t = 3B | | Column B | |
| t = 3B+1 | Column B+1 Set 1/2 | | Column B Set 1/2 |
| t = 3B+2 | Column B+1 Set 2/2 | | Column B Set 2/2 |
| t = 3B+3 | | Column B+1 | |
| ... | ... | ... | ... |

*FIG. 8*

DECODING OF LOW-DENSITY PARITY-CHECK CODES WITH HIGH-DEGREE VARIABLE NODES

TECHNICAL FIELD

This patent document generally relates to memory devices, and more specifically, to error correction in non-volatile memory devices.

BACKGROUND

Data integrity is an important feature for any data storage device and data transmission. Use of strong error-correction codes (ECCs) is recommended for various types of data storage devices including NAND flash memory devices.

Solid-state drives (SSDs) use multi-level NAND flash devices for persistent storage. However, multi-level NAND flash devices can be inherently unreliable and generally need to use ECCs to allow dramatic increase in data reliability at the expense of extra storage space for ECC parity bits. There is a demand for increasingly efficient ECCs that can provide data protection with lower complexity and lower latency.

SUMMARY

Embodiments of the disclosed technology relate to an efficient decoding method for low-density parity-check (LDPC) codes with high-degree variable nodes. Using a pipeline architecture to process low-weight columns in a single time-step and high-weight columns in multiple time-steps advantageously reduces the read-latency for controllers and improves the reliability of the SSDs.

In an example aspect, a method for improving decoding operations of a decoder is described. The method includes receiving a noisy codeword that is based on a transmitted codeword generated from a low-density parity-check (LDPC) code, the LDPC code having an associated parity matrix comprising N columns, wherein N is a positive integer, wherein each of at least B columns of the parity matrix has a column weight that exceeds a predetermined column weight, wherein B is a positive integer, and wherein B<N, processing the N columns based on a message passing algorithm between a plurality of variable nodes and a plurality of check nodes that represent the parity matrix of the LDPC code, and determining, based on the processing, a candidate version of the transmitted codeword, wherein the processing for each of the N columns comprises partitioning check nodes in each column into at least a first set and a second set, and performing a read operation, a variable node update (VNU) operation, and a check node update (CNU) operation on the first set and the second set, wherein the read operation, the VNU operation, and the CNU operation are performed for the first set prior to the second set, and wherein performing the read operation and the CNU operation on each of the at least B columns spans two or more time-steps.

In yet another example aspect, the above-described method may be implemented by a video encoder apparatus or a video decoder apparatus that comprises a processor.

In yet another example aspect, these methods may be embodied in the form of processor-executable instructions and stored on a computer-readable program medium.

The subject matter described in this patent document can be implemented in specific ways that provide one or more of the following features.

BRIEF DESCRIPTION OF THE DRAWINGS

FIG. 7 illustrates an example schedule for a 3-stage pipelined decoder for low-density parity-check (LDPC) codes and quasi-cyclic low-density parity-check (QC-LDPC) codes.

FIG. 8 illustrates another example schedule for a 3-stage pipelined decoder for LDPC codes that have B columns with high column weight.

DETAILED DESCRIPTION

Solid state drives (SSDs) are a new generation of storage device used in computers. SSDs replace traditional mechanical hard disks by using flash-based memory, which is significantly faster. SSDs speed up computers significantly due to their low read-access times and fast throughputs. SSDs can be configured to use LDPC codes or quasi-cyclic LDPC (QC-LDPC) codes to correct any bit-errors in pages read from NAND media. LDPC and QC-LDPC codes are used to ensure data integrity in storage systems that use the new generation of NAND flash memories.

FIGS. 1-6 overview a non-volatile memory system (e.g., a flash-based memory, NAND flash) in which embodiments of the disclosed technology may be implemented.

Figure 1:
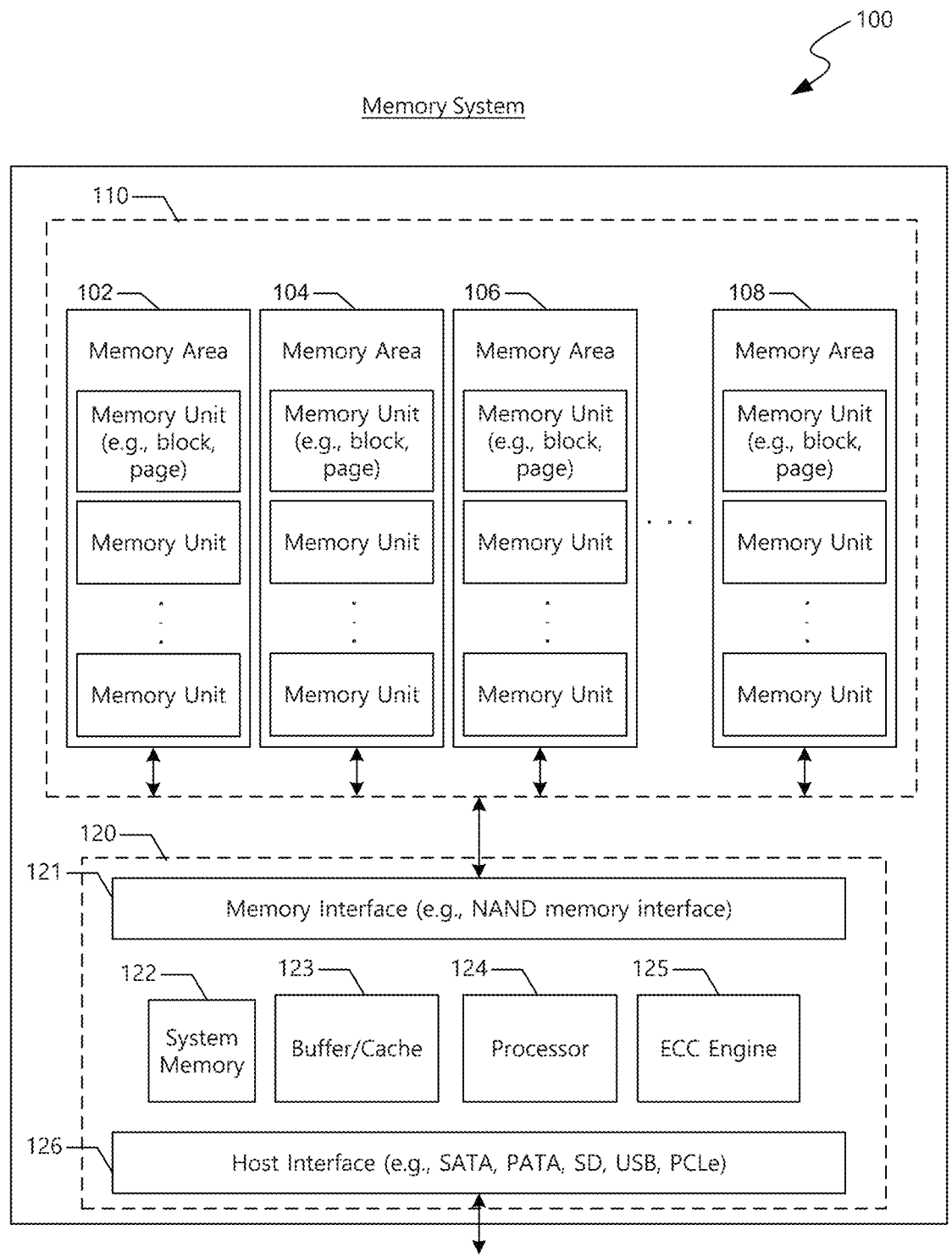
FIG. 1 illustrates an example of a memory system.

FIG. 1 is a block diagram of an example of a memory system 100 implemented based on some embodiments of the disclosed technology. The memory system 100 includes a memory module 110 that can be used to store information for use by other electronic devices or systems. The memory system 100 can be incorporated (e.g., located on a circuit board) in other electronic devices and systems. Alternatively, the memory system 100 can be implemented as an external storage device such as a USB flash drive and a solid-state drive (SSD).

The memory module 110 included in the memory system 100 can include memory areas (e.g., memory arrays) 102, 104, 106, and 108. Each of the memory areas 102, 104, 106, and 108 can be included in a single memory die or in multiple memory dice. The memory die can be included in an integrated circuit (IC) chip.

Each of the memory areas 102, 104, 106, and 108 includes a plurality of memory cells. Read, program, or erase operations can be performed on a memory unit basis. Thus, each memory unit can include a predetermined number of memory cells. The memory cells in a memory area 102, 104, 106, and 108 can be included in a single memory die or in multiple memory dice.

The memory cells in each of memory areas 102, 104, 106, and 108 can be arranged in rows and columns in the memory units. Each of the memory units can be a physical unit. For example, a group of a plurality of memory cells can form a memory unit. Each of the memory units can also be a logical unit. For example, the memory unit can be a block or a page that can be identified by a unique address such as a block address or a page address, respectively. For another example, wherein the memory areas 102, 104, 106, and 108 can include computer memories that include memory banks as a logical unit of data storage, the memory unit can be a bank that can be identified by a bank address. During a read or write operation, the unique address associated with a particular memory unit can be used to access that particular memory unit. Based on the unique address, information can be written to or retrieved from one or more memory cells in that particular memory unit.

The memory cells in the memory areas 102, 104, 106, and 108 can include non-volatile memory cells. Examples of non-volatile memory cells include flash memory cells, phase change random-access memory (PRAM) cells, magnetoresistive random-access memory (MRAM) cells, or other types of non-volatile memory cells. In an example implementation where the memory cells are configured as NAND flash memory cells, the read or write operation can be performed on a page basis. However, an erase operation in a NAND flash memory is performed on a block basis.

Each of the non-volatile memory cells can be configured as a single-level cell (SLC) or multiple-level memory cell. A single-level cell can store one bit of information per cell. A multiple-level memory cell can store more than one bit of information per cell. For example, each of the memory cells in the memory areas 102, 104, 106, and 108 can be configured as a multi-level cell (MLC) to store two bits of information per cell, a triple-level cell (TLC) to store three bits of information per cell, or a quad-level cells (QLC) to store four bits of information per cell. In another example, each of the memory cells in memory area 102, 104, 106, and 108 can be configured to store at least one bit of information (e.g., one bit of information or multiple bits of information), and each of the memory cells in memory area 102, 104, 106, and 108 can be configured to store more than one bit of information.

As shown in FIG. 1, the memory system 100 includes a controller module 120. The controller module 120 includes a memory interface 121 to communicate with the memory module 110, a host interface 126 to communicate with a host (not shown), a processor 124 to execute firmware-level code, and caches and memories 123 and 122, respectively to temporarily or persistently store executable firmware/instructions and associated information. In some implementations, the controller unit 120 can include an error correction engine 125 to perform error correction operation on information stored in the memory module 110. Error correction engine 125 can be configured to detect/correct single bit error or multiple bit errors. In another implementation, error correction engine 125 can be located in the memory module 110.

The host can be a device or a system that includes one or more processors that operate to retrieve data from the memory system 100 or store or write data into the memory system 100. In some implementations, examples of the host can include a personal computer (PC), a portable digital device, a digital camera, a digital multimedia player, a television, and a wireless communication device.

In some implementations, the controller module 120 can also include a host interface 126 to communicate with the host. Host interface 126 can include components that comply with at least one of host interface specifications, including but not limited to, Serial Advanced Technology Attachment (SATA), Serial Attached Small Computer System Interface (SAS) specification, Peripheral Component Interconnect Express (PCIe).

Figure 2:
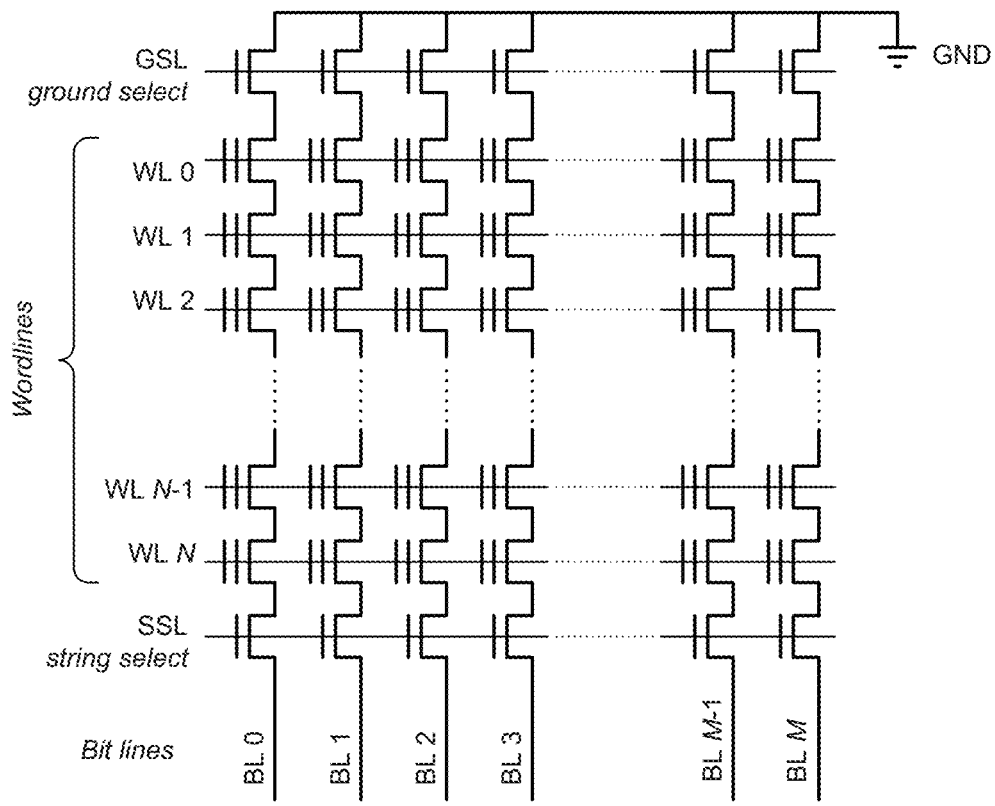
FIG. 2 is an illustration of an example non-volatile memory device.

FIG. 2 illustrates an example of a memory cell array implemented based on some embodiments of the disclosed technology.

In some implementations, the memory cell array can include NAND flash memory array that is partitioned into many blocks, and each block contains a certain number of pages. Each block includes a plurality of memory cell strings, and each memory cell string includes a plurality of memory cells.

In some implementations where the memory cell array is NAND flash memory array, read and write (program) operations are performed on a page basis, and erase operations are performed on a block basis. All the memory cells within the same block must be erased at the same time before performing a program operation on any page included in the block. In an implementation, NAND flash memories may use an even/odd bit-line structure. In another implementation, NAND flash memories may use an all-bit-line structure. In the even/odd bit-line structure, even and odd bit-lines are interleaved along each word-line and are alternatively accessed so that each pair of even and odd bit-lines can share peripheral circuits such as page buffers. In all-bit-line structure, all the bit-lines are accessed at the same time.

Figure 3:
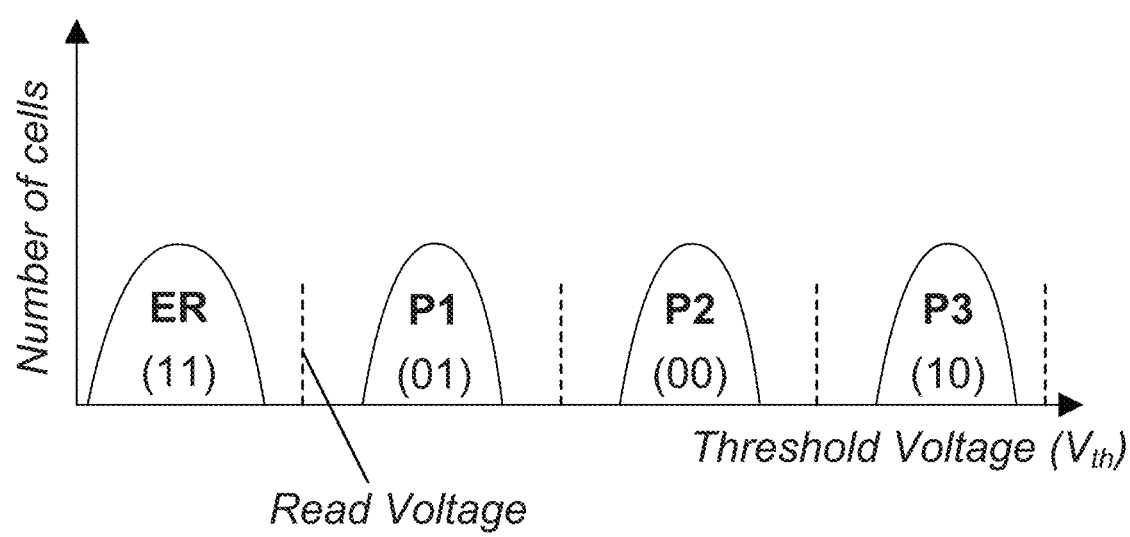
FIG. 3 is an example diagram illustrating the cell voltage level distribution (Vth) of a non-volatile memory device.

FIG. 3 illustrates an example of threshold voltage distribution curves in a multi-level cell device, wherein the number of cells for each program/erase state is plotted as a function of the threshold voltage. As illustrated therein, the threshold voltage distribution curves include the erase state (denoted "ER" and corresponding to "11") with the lowest threshold voltage, and three program states (denoted "P1", "P2" and "P3" corresponding to "01", "00" and "10", respectively) with read voltages in between the states (denoted by the dotted lines). In some embodiments, each of the threshold voltage distributions of program/erase states has a finite width because of differences in material properties across the memory array.

Although FIG. 3 shows a multi-level cell device by way of example, each of the memory cells can be configured to store any number of bits per cell. In some implementations, each of the memory cells can be configured as a single-level cell (SLC) to store one bit of information per cell, or as a triple-level cell (TLC) to store three bits of information per cell, or as a quad-level cells (QLC) to store four bits of information per cell.

In writing more than one data bit in a memory cell, fine placement of the threshold voltage levels of memory cells is needed because of the reduced distance between adjacent distributions. This is achieved by using incremental step pulse program (ISPP), i.e., memory cells on the same word-line are repeatedly programmed using a program-and-verify approach with a stair case program voltage applied to word-lines. Each programmed state associates with a verify voltage that is used in verify operations and sets the target position of each threshold voltage distribution window.

Read errors can be caused by distorted or overlapped threshold voltage distribution. An ideal memory cell threshold voltage distribution can be significantly distorted or overlapped due to, e.g., program and erase (P/E) cycle, cell-to-cell interference, and data retention errors, which will be discussed in the following, and such read errors may be managed in most situations by using error correction codes (ECC).

Figure 4:
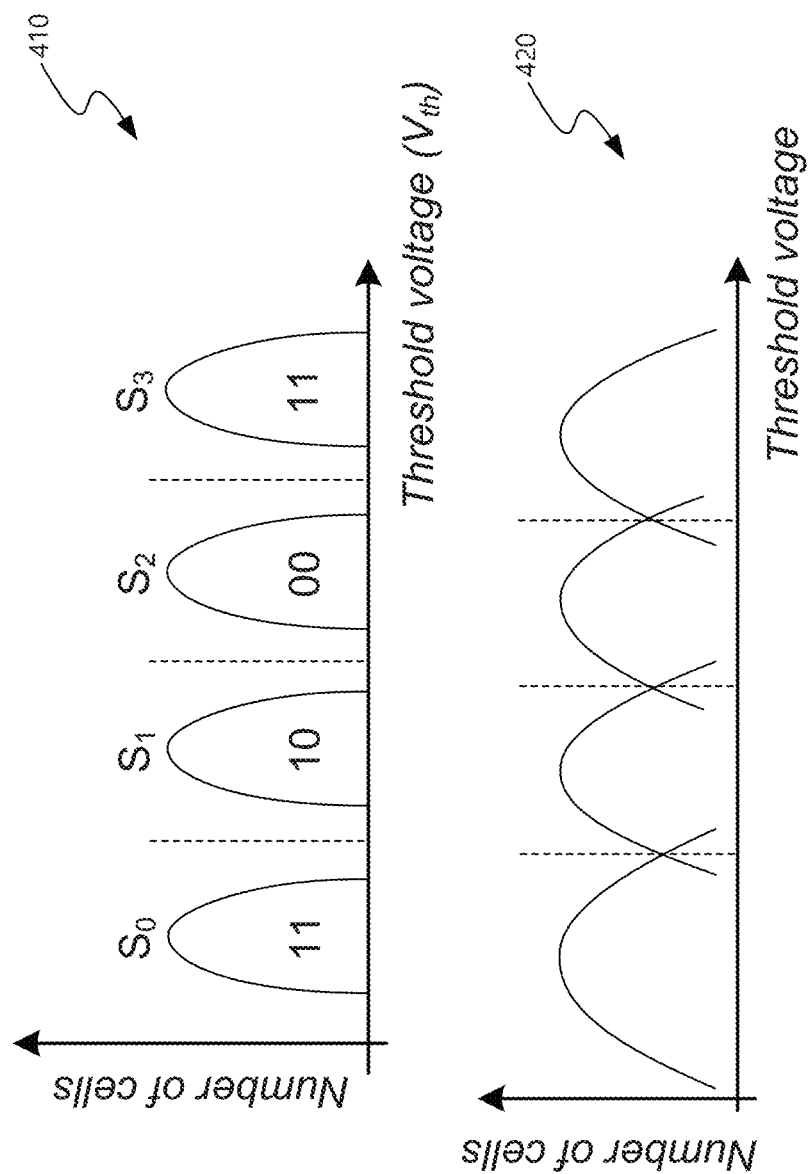
FIG. 4 is another example diagram illustrating the cell voltage level distribution (Vth) of a non-volatile memory device.

FIG. 4 illustrates an example of ideal threshold voltage distribution curves 410 and an example of distorted threshold voltage distribution curves 420. The vertical axis indicates the number of memory cells that has a particular threshold voltage represented on the horizontal axis.

For n-bit multi-level cell NAND flash memory, the threshold voltage of each cell can be programmed to $2_n$ possible values. In an ideal multi-level cell NAND flash memory, each value corresponds to a non-overlapping threshold voltage window.

Flash memory P/E cycling causes damage to a tunnel oxide of floating gate of a charge trapping layer of cell transistors, which results in threshold voltage shift and thus gradually degrades memory device noise margin. As P/E cycles increase, the margin between neighboring distributions of different programmed states decreases and eventually the distributions start overlapping. The data bit stored in a memory cell with a threshold voltage programmed in the overlapping range of the neighboring distributions may be misjudged as a value other than the original targeted value.

Figure 5:
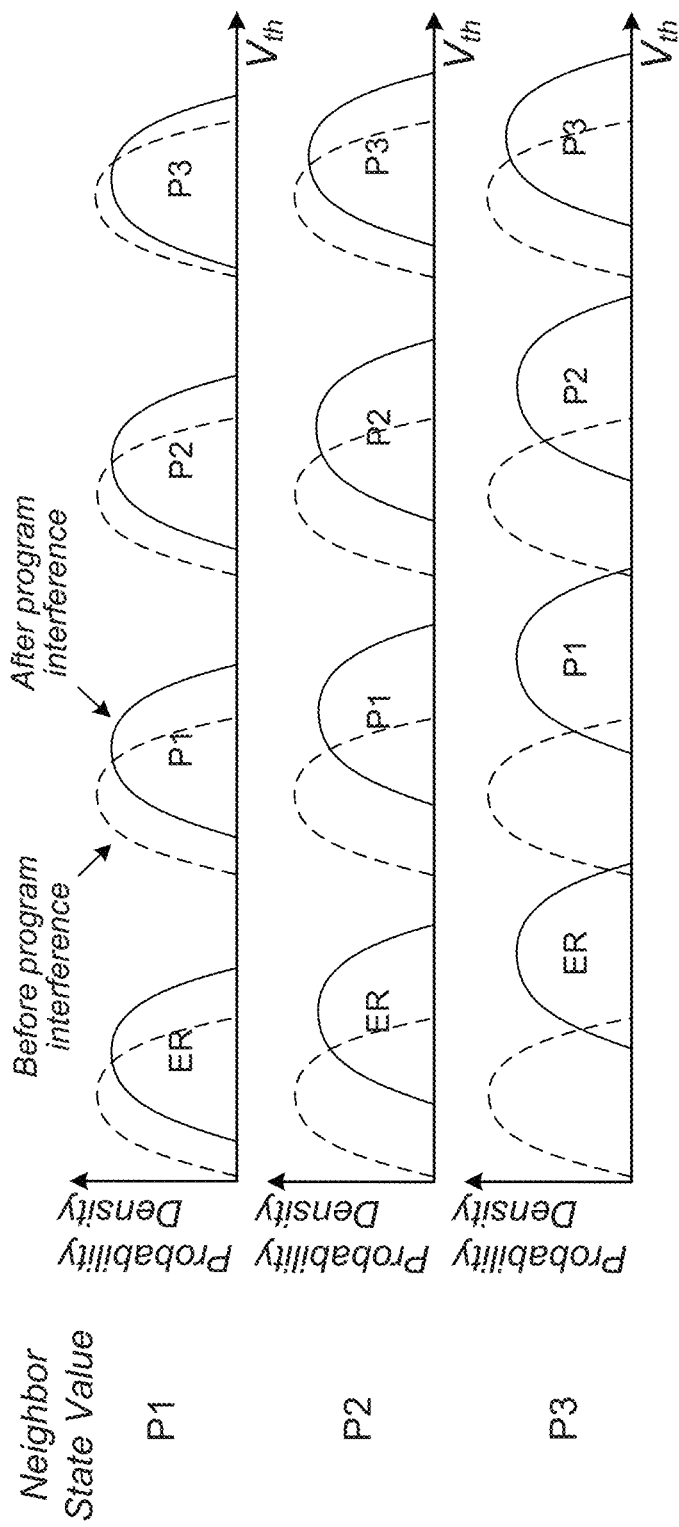
FIG. 5 is an example diagram illustrating the cell voltage level distribution (Vth) of a non-volatile memory device before and after program interference.

FIG. 5 illustrates an example of a cell-to-cell interference in NAND flash memory. The cell-to-cell interference can also cause threshold voltages of flash cells to be distorted. The threshold voltage shift of one memory cell transistor can influence the threshold voltage of its adjacent memory cell transistor through parasitic capacitance-coupling effect between the interfering cell and the victim cell. The amount of the cell-to-cell interference may be affected by NAND flash memory bit-line structure. In the even/odd bit-line structure, memory cells on one word-line are alternatively connected to even and odd bit-lines and even cells are programmed ahead of odd cells in the same word-line. Therefore, even cells and odd cells experience different amount of cell-to-cell interference. Cells in all-bit-line structure suffer less cell-to-cell interference than even cells in the even/odd bit-line structure, and the all-bit-line structure can effectively support high-speed current sensing to improve the memory read and verify speed.

The dotted lines in FIG. 5 denote the nominal distributions of P/E states (before program interference) of the cells under consideration, and the "neighbor state value" denotes the value that the neighboring state has been programmed to. As illustrated in FIG. 5, if the neighboring state is programmed to P1, the threshold voltage distributions of the cells under consideration shift by a specific amount. However, if the neighboring state is programmed to P2, which has a higher threshold voltage than P1, that results in a greater shift compared to the neighboring state being P1. Similarly, the shift in the threshold voltage distributions is greatest when the neighboring state is programmed to P3.

Figure 6:
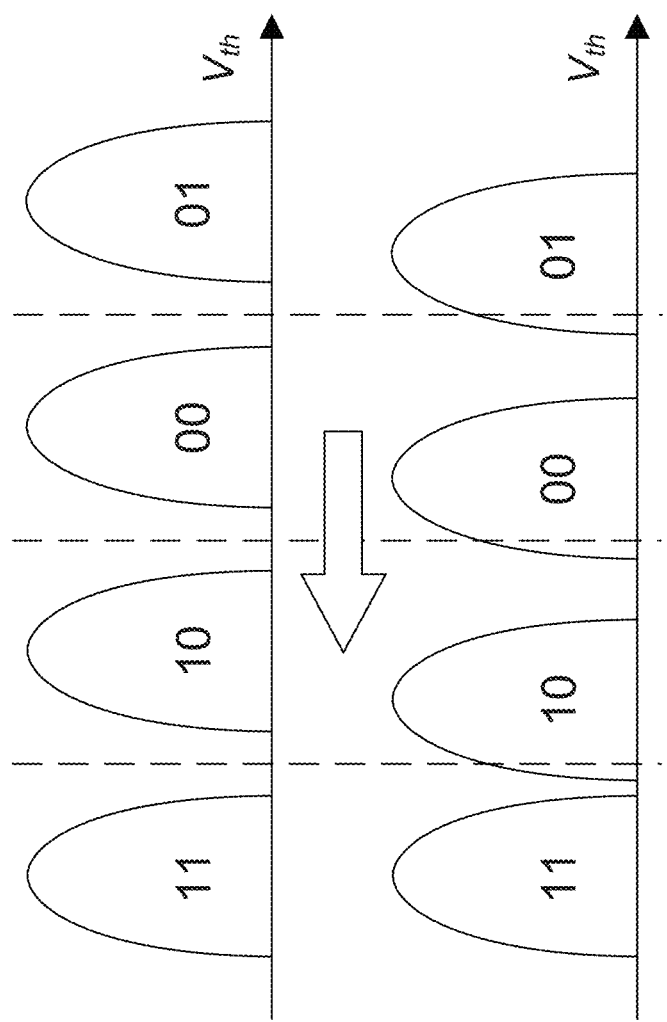
FIG. 6 is an example diagram illustrating the cell voltage level distribution (Vth) of a non-volatile memory device as a function of the reference voltage.

FIG. 6 illustrates an example of a retention error in NAND flash memory by comparing normal threshold-voltage distribution and shifted threshold-voltage distribution. The data stored in NAND flash memories tend to get corrupted over time and this is known as a data retention error. Retention errors are caused by loss of charge stored in the floating gate or charge trap layer of the cell transistor. Due to wear of the floating gate or charge trap layer, memory cells with more program erase cycles are more likely to experience retention errors. In the example of FIG. 6, comparing the top row of voltage distributions (before corruption) and the bottom row of distributions (contaminated by retention error) reveals a shift to the left.

LDPC codes are often used to as forward error correction codes in non-volatile memory devices (e.g., as described in FIGS. 1-6) due to their excellent correction performance and low complexity. LDPC decoders can be configured to operate using low-complexity iterative message-passing decoding methods like bit-flipping, min-sum or sum-product algorithms. The decoding latency of the decoder is primary affected by the scheduling of the iterative message-passing decoding method used by the decoder.

In an example, a decoding method that implements a flooding schedule performs all variable node update (VNU) operations followed by all check node update (CNU) operations. This flooding decoder has a relatively low-complexity implementation but requires a higher number of decoding iterations (and therefore higher latency) because updated messages are not used till the next decoding iteration.

In another example, a vertical scheduling method can be implemented wherein the decoder performs a VNU operation and then immediately performs CNU operations for the check nodes associated with the variable node that was just processed. This allows the latest value in each node update to be used, and consequently, the decoder requires fewer decoding iterations to correct bit errors in the received codeword.

When quasi-cyclic LDPC codes are used, the decoder may perform node updates in parallel where the number of nodes updated may be equal to the size of the circulant submatrices in the quasi-cyclic parity-check matrix. To achieve a low latency for each decoding iteration, an implementation of the decoder may perform the variable node update and check node update operations in a pipelined fashion as illustrated in FIG. 7.

As illustrated in FIG. 7, at time t=1, circulant column 1 is processed in stage 1 that reads the check node memory for the rows connected to the corresponding column and computes the incoming messages for the corresponding variable node. At time 1-2, the check node memory reading operation is performed on circulant column 2 concurrently with the VNU operation (stage 2) being performed on circulant column 1. And at time t=3, circulant columns 1-3 are simultaneously processed in stages 1-3 that implement the CN memory read operation, the VNU operation, and the CNU operation, respectively. The CNU in stage 3 performs the CNU operations for the rows connected to the selected column.

In some embodiments, the correction capability of an LDPC code depends on the degree distribution of the variable nodes (or equivalently, the column-weight distribution of its parity-check matrix). For a large correction capability, the presence of a few columns with large weights is typically necessary. A decoder following the schedule illustrated in FIG. 7 would require additional hardware to be able to perform the VNU and CNU operations corresponding to the column with the largest weight. This can cause a two-fold to three-fold increase in the gate-count of the decoder implementation.

Embodiments of the disclosed technology implement a decoder with reasonable gate-count and latency that is able to use optimal degree-distribution with a few large degree variable nodes for large correction capability. In an example, the rows of the parity-check matrix of the LDPC code are partitioned into two or more sets. For columns with large weights, the CNU operations for each set are performed in separate time-steps with a fixed order in a pipelined architecture, as illustrated in FIG. 8. This decoder implementation only requires hardware to perform CNU operations for all rows in one set rather than for the column weight. The parity-check matrix is designed such that the columns immediately after any large weight columns do not connect to rows that belong to sets for which pending CNU operations have not been completed. For a QC-LDPC code, the rows are partitioned such that rows belonging to the same row-circulant are part of the same set.

In some embodiments, a time-step corresponds to a fixed number of clock cycles, wherein a clock cycle is the amount of time between two pulses of an oscillator in a processor (e.g., a central processing unit (CPU)). For example, a processor operating at 2 GHz performs 2,000,000,000 clock cycles per second.

In some embodiments, a time-step is equal to one clock cycle. In other embodiments, a time-step is equal to N clock cycles, where N is an integer greater than one. In yet other embodiment, a time-step is equal to a time-unit defined by a reference timing signal used by the processor (e.g., a pulse per second (PPS) signal).

An LDPC code is represented by a parity-check matrix $H=[h_{ij}]_{M \times N}$ where $h_{ij} \in F_2$ is equal to 1 if and only if the $i^{th}$ check-node is connected to the $j^{th}$ variable node. The weight of the $j^{th}$ column (or equivalently, the degree of the $j^{th}$ variable-node) is denoted by $w_j$. As discussed earlier, LDPC decoders can be configured to operate using iterative message-passing decoding methods like min-sum, sum-product or bit-flipping algorithms.

In the min-sum algorithm, the messages that are exchanged are based on logarithms of the probabilities. For example, a message that is sent from a variable node (v) to a check node (w) corresponds to the reliability of the symbol x in coordinate v as determined by all the check equations that include it except w itself. Subsequently, a message that is sent from the check node to the variable node is a local estimate of the reliability of the symbol x in coordinate v as determined by all the other coordinates that enter the check node w. The min-sum algorithm is terminated either when it converges (further iterations do not alter the local costs) or after a predetermined number of iterations.

The sum-product algorithm is similar to the min-sum algorithm, as described above, except the messages that are exchanged in the sum-product algorithm are based on probabilities themselves (and not logarithms of the probabilities).

In a bit-flipping algorithm, each check node introduces a constraint, and the algorithm tries to find a bit, flipping of which reduces the number of unsatisfied clauses. The algorithm stops when for every bit, the number of unsatisfied constraints is less or equal to the number of satisfied constraints. Since the number of unsatisfied constraints reduces in each step, the algorithm has to stop.

The vertical scheduling method of a LDPC decoder may be implemented by the pipelined architecture illustrated in FIG. 7. As described above, all variable-nodes are processed once per decoding-iteration, and the check-nodes connected to the variable-nodes are processed immediately after the VNU operations are completed.

As illustrated in FIG. 7, the processing for each column is divided into three stages. In the first stage, the memory corresponding to the check-nodes connected to the variable-node of the column is read and the incoming messages for the variable node are computed.

In the second stage, the VNU operations are performed. In an example, for min-sum or sum-product decoders, performing the VNU operations includes performing a summation of the channel message and the incoming messages from the previous stage to compute the hard decision as well as the extrinsic outgoing messages. In another example, for a bit-flipping decoder, performing the VNU operations includes counting the number of neighbor check-nodes that are unsatisfied and deciding whether the hard decision for the variable-node should be flipped.

In the third stage, the CNU operations are performed for the associated check-nodes based on the outgoing messages generated in the VNU stage. Due to the pipelined-architecture, multiple columns are processed at the same time step, although each column is at a different stage. For example, at time t=4, the first stage of Column 4 is being performed to determine incoming messages for the variable node corresponding to Column 4. At the same time, the second stage or the VNU operation is being performed for Column 3 based on the CN memory read at t=3, and the third stage comprising the CNU operations are being performed for the check nodes associated with Column 2.

A pipelined-architecture implementation typically includes sufficient hardware to perform all stages in a single time-step. For example, to process a column with weight w, the hardware must be able to read CN memory from w locations in one time-step for stage 1, be able to process VNU operations with w incoming messages in one time-step and perform CNU operations for w check-nodes in one time-step. Thus, the gate-count of the decoder increases linearly with the maximum column-weight $$\max_{1 \le v \le N} w_v.$$

As discussed above, LDPC codes with good correction performance often have a few columns with large column weight in their parity check matrix H. Embodiments of the disclosed technology assume that the first B columns of H have large column weight, which is represented, without loss of generality, as:

$$w_j > \max_{v > B} w_v \forall\, 1 \le j \le B.$$

This assumption is for illustrative purposes only, and the columns with large column weights can appear at other indices.

When an LDPC code is implemented using the pipeline architecture illustrated in FIG. 7, the gate-count may be many fold higher to ensure that all the stages can be performed in a single time-step. For example, when less than 2% of the columns have a large column weight (i.e., (B/N)<0.02) and columns with a large column weight have a weight that is 2-3 (q) times the column weight of the other columns (i.e., $$w_j = \eta \cdot \max_{v > B} w_v \forall\, 1 \le j \le B),$$

then the gate-count is approximately q times higher than a non-pipelined architecture. However, most of this additional hardware is not used when (N−B) columns, which corresponds to the columns with regular weight, out of the total N columns are being processed.

In contrast to implementations that use the pipelined architecture illustrated in FIG. 7, embodiments of the disclosed technology keep the gate-count substantially constant, when column weights increase for a small number of columns, at the cost of marginally increasing the latency of the iterative decoder. This is achieved, in part, by splitting the processing of the first B columns such that some stages take two or more time-steps and partitioning all the rows of the parity check matrix of the LDPC code into two or more sets and processing the multiple sets in a specific order.

An example of a pipelined architecture, which splits the processing of the first B columns such that some stages take two or more time-steps, is illustrated in FIG. 8. As shown therein, the VNU stage is completed in a single time-step, but reading from and writing to the CN memory takes two (or more) time-steps to ensure that the total gate-count does not increase. Thus, Stage 1 for Column 1 is split over two time-steps, e.g., t=1 and t=2. Similarly, Stage 3 for Column 1 is split over time-steps t=4 and t=5.

The pipelined architecture illustrated in FIG. 8 also shows the partitioning of all rows of the parity check matrix H (or equivalently, all the check nodes) into two or more sets such that the check nodes in the first/second set are processed in the first/second time-step of the split processing. For example, as shown in FIG. 8, only check nodes belonging to Set 1 of Column 1 (denoted Set 1/2 in FIG. 8) are processed in time-step t=1, and check nodes belonging to Set 2 of Column 1 (denoted Set 2/2 in FIG. 8) are delayed and processed in time-step t=2.

Furthermore, the order of processing is fixed such that the check nodes in Set 1 are always processed before the check nodes in Set 2. This advantageously ensures that updates messages are available for the processing of subsequent columns of the parity check matrix. For example, at time-step t=4, Set 1 of Column 1 is processed in Stage 3, and Set 2 of Column 1 is processed in time-step t=5 in Stage 3. These Stage 3 processing steps are performed concurrently with the Set 1 and Set 2 operations of Column 2 in Stage 1 in time-steps t=4 and t=5, respectively.

In some embodiments, the $(B+1)^{th}$ column of H is constrained such that all the rows it connects to belong to the same set. This ensures that the Stage 1 processing of Column (B+1) at t=3B+1 reads the CN memory from those check nodes which have either been updated by the Stage 3 processing of Column B (if they belong to Set 1), or that they have not been updated yet (if they belong to Set 2). Without this constraint, the information read by the Stage 3 processing steps of Column (B+1) may be partly updated and partly out-of-date which can result in erroneous decoding.

Embodiments of the disclosed technology can increase the scheduling latency of each decoding iteration by roughly 2B time-steps, with a relative increase in latency per decoding iteration of 2B/N (e.g., which is less than 4% when B<<N). This advantageously reduces the gate count compared to the use of the scheduling algorithm shown in FIG. 7, with only a minimal increase in latency per decoding iteration. The constraints imposed on the H matrix are easy to satisfy and do not restrict the use of optimal degree distributions which can provide significant correction capability.

In some embodiments, the pipelined architectures described herein (e.g., as shown in FIGS. 7 and 8) can be configured such that the VNU operation for each column requires more than one time-step.

In some embodiments, the pipelined architectures described herein (e.g., as shown in FIGS. 7 and 8) can be configured such that each of the CN memory read, VNU and CNU operations for each column require more than two time-steps. This can advantageously reduce the gate count for parity-check matrices which have columns with much higher weights than typical implementations.

In some embodiments, the pipelined architectures (e.g., as shown in FIGS. 7 and 8) can be implemented to decode QC-LDPC in which one or more circulant columns, or a portion of the variable nodes belonging to the circulant-column, are processed in parallel.

Figure 9:
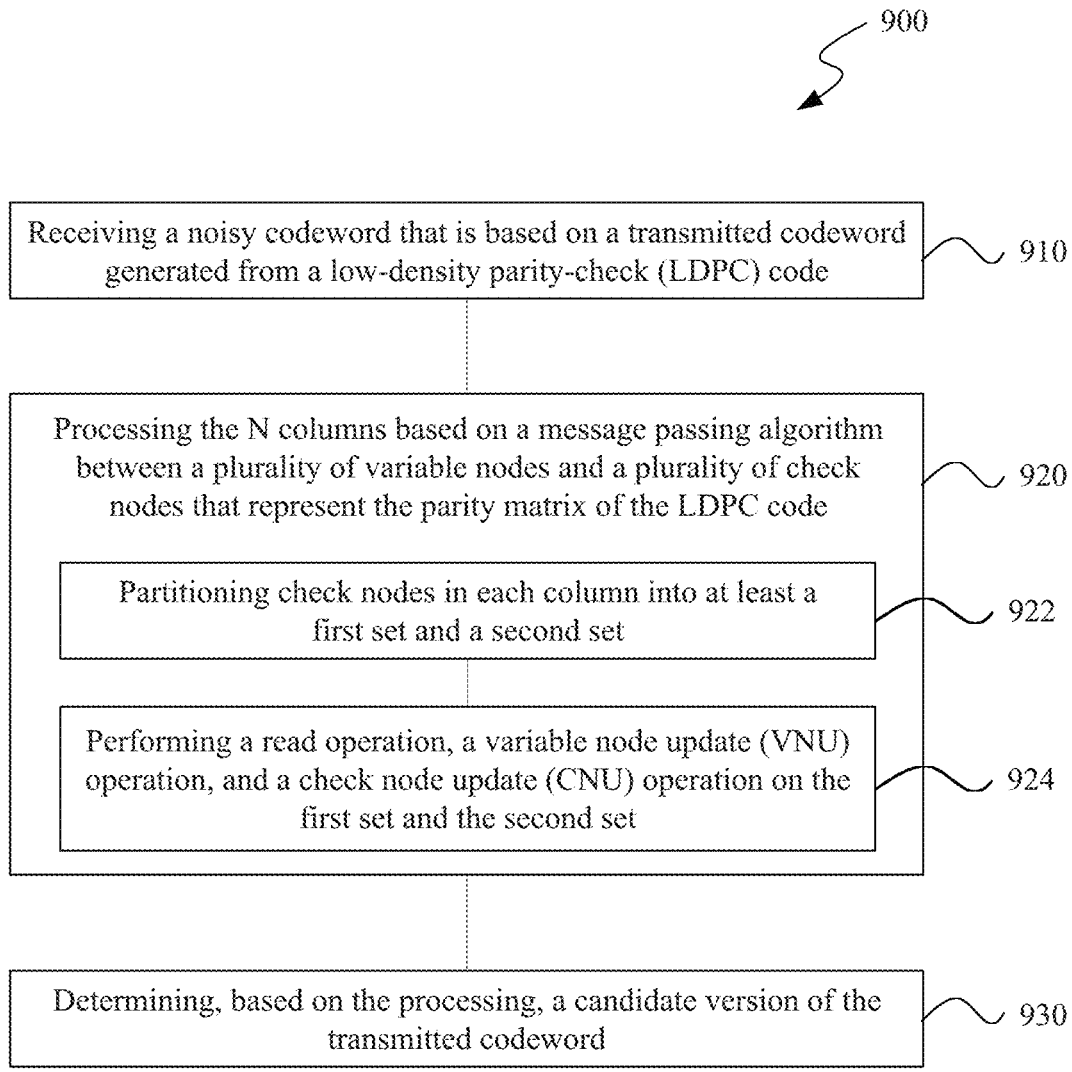
FIG. 9 illustrates a flowchart of an example method for improving decoding operations of a decoder in a non-volatile memory.

FIG. 9 illustrates a flowchart of a method 900 for improving decoding operations of a decoder in a non-volatile memory. The method 900 includes, at operation 910, receiving a noisy codeword that is based on a transmitted codeword generated from a low-density parity-check code, the LDPC code having an associated parity matrix comprising N columns, wherein N is a positive integer, wherein each of at least B columns of the parity matrix has a column weight that exceeds a predetermined column weight, wherein B is a positive integer, and wherein B<N.

The method 900 includes, at operation 920, processing the N columns based on a message passing algorithm between a plurality of variable nodes and a plurality of check nodes that represent the parity matrix of the LDPC code.

Operation 920 includes, at operation 922, partitioning check nodes in each column into at least a first set and a second set.

Operation 920 includes, at operation 924, performing a read operation, a variable node update (VNU) operation, and a check node update (CNU) operation on the first set and the second set, wherein the read operation, the VNU operation, and the CNU operation are performed for the first set prior to the second set, and wherein performing the read operation and the CNU operation on each of the at least B columns spans two or more time-steps (for example, as illustrated in FIG. 8).

The method 900 includes, at operation 930, determining, based on the processing, a candidate version of the transmitted codeword.

In some embodiments, the CNU operation for the first set and the second set are performed subsequent to the VNU operation.

In some embodiments, the decoder comprises a min-sum decoder or a sum-product decoder, and wherein performing the VNU operation comprises computing a summation of a channel message and an incoming message.

In some embodiments, the decoder comprises a bit-flipping decoder, and wherein performing the VNU operation comprises counting a number of unsatisfied neighboring check nodes.

In some embodiments, performing the VNU operation on each of the at least B columns spans two or more time-steps.

In some embodiments, column indexes of the at least B columns of the parity check matrix are 1, 2, . . . , B, and processing the N columns comprises partitioning check nodes in a (B+1)-th column into at least a first set and a second set, wherein all rows of the parity check matrix that are connected to the (B+1)-th column with partitioned check nodes are only in the first set or only in the second set.

In some embodiments, the decoder comprises an iterative decoder, and the method 900 further comprises performing a subsequent iteration upon a determination that a checksum for the candidate transmitted codeword is not equal to zero.

In some embodiments, the decoder comprises an iterative decoder, and the method 900 further comprises refraining from performing a subsequent iteration upon a determination that a checksum for the candidate transmitted codeword is equal to zero or a maximum number of iterations has been performed.

In some embodiments, the LDPC code comprises a QC-LDPC code.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them.

Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for improving decoding operations of a decoder in a non-volatile memory, comprising:

receiving a noisy codeword that is based on a transmitted codeword generated from a low-density parity-check (LDPC) code, the LDPC code having an associated parity matrix comprising N columns, wherein N is a positive integer, wherein each of at least B columns of the parity matrix has a column weight that exceeds a predetermined column weight, wherein B is a positive integer, and wherein B is less than N;

processing the N columns based on a message passing algorithm between a plurality of variable nodes and a plurality of check nodes that represent the parity matrix of the LDPC code; and determining, based on the processing, a candidate version of the transmitted codeword, wherein the processing for each of the N columns comprises:

partitioning check nodes in each column into at least a first set and a second set, and performing a read operation, a variable node update (VNU) operation, and a check node update (CNU) operation on the first set and the second set, wherein the read operation, the VNU operation, and the CNU operation are performed for the first set prior to the second set, wherein performing the read operation and the CNU operation on each of the at least B columns spans two or more time-steps, and wherein a time-step corresponds to a fixed number of clock cycles utilized by a processor associated with the non-volatile memory.

2. The method of claim 1, wherein the CNU operation for the first set and the second set are performed subsequent to the VNU operation.

3. The method of claim 1, wherein the decoder comprises a min-sum decoder or a sum-product decoder, and wherein the method, as part of performing the VNU operation, further comprises computing a summation of a channel message and an incoming message.

4. The method of claim 1, wherein the decoder comprises a bit-flipping decoder, and wherein the method, as part of performing the VNU operation, further comprises counting a number of unsatisfied neighboring check nodes.

5. The method of claim 1, wherein performing the VNU operation on each of the at least B columns spans two or more time-steps.

6. The method of claim 1, wherein the decoder comprises an iterative decoder, and wherein the method further comprises:
performing a subsequent iteration upon a determination that a checksum for the candidate version of the transmitted codeword is not equal to zero, or
refraining from performing a subsequent iteration upon a determination that a checksum for the candidate transmitted codeword is equal to zero or a maximum number of iterations has been performed.

7. The method of claim 1, wherein column indexes of the at least B columns of the parity check matrix are 1, 2, . . . , B, and wherein processing the N columns comprises:
partitioning check nodes in a (B+1)-th column into at least a first set and a second set, wherein all rows of the parity check matrix that are connected to the (B+1)-th column with partitioned check nodes are only in the first set or only in the second set.

8. The method of claim 1, wherein the LDPC code comprises a quasi-cyclic low-density parity-check (QC-LDPC) code.

9. A device for improving decoding operations of a decoder in a non-volatile memory, comprising:
a processor and a memory including instructions stored thereupon, wherein the instructions upon execution by the processor cause the processor to:
receive a noisy codeword that is based on a transmitted codeword generated from a low-density parity-check (LDPC) code, the LDPC code having an associated parity matrix comprising N columns, wherein N is a positive integer, wherein each of at least B columns of the parity matrix has a column weight that exceeds a predetermined column weight, wherein B is a positive integer, and wherein B is less than N;
process the N columns based on a message passing algorithm between a plurality of variable nodes and a plurality of check nodes that represent the parity matrix of the LDPC code; and
determine, based on the processing, a candidate version of the transmitted codeword,
wherein the processor is configured, as part of processing each of the N columns, to:
partition check nodes in each column into at least a first set and a second set, and
perform a read operation, a variable node update (VNU) operation, and a check node update (CNU) operation on the first set and the second set, wherein the read operation, the VNU operation, and the CNU operation are performed for the first set prior to the second set, wherein performing the read operation and the CNU operation on each of the at least B columns spans two or more time-steps, and wherein a time-step corresponds to a fixed number of clock cycles utilized by a processor associated with the non-volatile memory.

10. The device of claim 9, wherein the CNU operation for the first set and the second set are performed subsequent to the VNU operation.

11. The device of claim 9, wherein the decoder comprises a min-sum decoder or a sum-product decoder, and wherein the processor is configured, as part of performing the VNU operation, to compute a summation of a channel message and an incoming message.

12. The device of claim 9, wherein the decoder comprises a bit-flipping decoder, and wherein the processor is configured, as part of performing the VNU operation, to count a number of unsatisfied neighboring check nodes.

13. The device of claim 9, wherein performing the VNU operation on each of the at least B columns spans two or more time-steps.

14. The device of claim 9, wherein the decoder comprises an iterative decoder, and wherein the processor is further configured to:
perform a subsequent iteration upon a determination that a checksum for the candidate version of the transmitted codeword is not equal to zero.

15. The device of claim 9, wherein the decoder comprises an iterative decoder, and wherein the processor is further configured to:
refrain from performing a subsequent iteration upon a determination that a checksum for the candidate version of the transmitted codeword is equal to zero or a maximum number of iterations has been performed.

16. A non-transitory computer-readable storage medium having instructions stored thereupon for improving decoding operations of a decoder in a non-volatile memory, comprising:
instructions for receiving a noisy codeword that is based on a transmitted codeword generated from a low-density parity-check (LDPC) code, the LDPC code having an associated parity matrix comprising N columns, wherein N is a positive integer, wherein each of at least B columns of the parity matrix has a column weight that exceeds a predetermined column weight, wherein B is a positive integer, and wherein B is less than N;
instructions for processing the N columns based on a message passing algorithm between a plurality of variable nodes and a plurality of check nodes that represent the parity matrix of the LDPC code; and
instructions for determining, based on the processing, a candidate version of the transmitted codeword,
wherein the instructions for processing each of the N columns comprise:
instructions for partitioning check nodes in each column into at least a first set and a second set, and
instructions for performing a read operation, a variable node update (VNU) operation, and a check node update (CNU) operation on the first set and the second set, wherein the read operation, the VNU operation, and the CNU operation are performed for the first set prior to the second set, wherein performing the read operation and the CNU operation on each of the at least B columns spans two or more time-steps, and wherein a time-step corresponds to a fixed number of clock cycles utilized by a processor associated with the non-volatile memory.

17. The non-transitory computer-readable storage medium of claim 16, wherein the CNU operation for the first set and the second set are performed subsequent to the VNU operation.

18. The non-transitory computer-readable storage medium of claim 16, wherein the decoder comprises a min-sum decoder or a sum-product decoder, and wherein the instructions for performing the VNU operation comprise instructions for computing a summation of a channel message and an incoming message.

19. The non-transitory computer-readable storage medium of claim 16, wherein the decoder comprises a bit-flipping decoder, and wherein the instructions for performing the VNU operation comprise instructions for counting a number of unsatisfied neighboring check nodes.

20. The non-transitory computer-readable storage medium of claim 16, wherein the LDPC code comprises a quasi-cyclic low-density parity-check (QC-LDPC) code.

* * * * *